United States Patent [19]

Olson

[11] Patent Number: 4,617,733
[45] Date of Patent: Oct. 21, 1986

[54] PROCESS OF MANUFACTURING A FLEXIBLE SUBSTRATE ASSEMBLY

[75] Inventor: Thor Olson, Wheaton, Ill.

[73] Assignee: Molex Incorporated, Lisle, Ill.

[21] Appl. No.: 791,471

[22] Filed: Dec. 27, 1985

Related U.S. Application Data

[62] Division of Ser. No. 597,637, Apr. 6, 1984.

[51] Int. Cl.[4] ............................................. H01R 43/16
[52] U.S. Cl. ........................................ 29/874; 29/825; 339/17 M
[58] Field of Search ................. 29/825, 828, 874, 884, 29/758, 760; 339/17 M; 206/331, 329

[56] References Cited

U.S. PATENT DOCUMENTS

| | | | |
|---|---|---|---|
| 3,238,455 | 3/1966 | Jankowski | 206/331 X |
| 3,601,890 | 8/1971 | Pityo et al. | 29/874 |
| 3,611,562 | 10/1971 | Herb | 339/17 M X |
| 4,061,405 | 12/1977 | Minter | 29/760 X |
| 4,371,078 | 2/1983 | Hunt et al. | 206/329 |

FOREIGN PATENT DOCUMENTS

| | | | |
|---|---|---|---|
| 1047118 | 12/1958 | Fed. Rep. of Germany | 206/329 |
| 3143604 | 5/1983 | Fed. Rep. of Germany | 206/329 |
| 45-29952 | 9/1970 | Japan | 29/825 |

*Primary Examiner*—Howard N. Goldberg
*Assistant Examiner*—Carl J. Arbes
*Attorney, Agent, or Firm*—Louis A. Hecht

[57] ABSTRACT

A method of packaging solid members having rigid projections, e.g., electrical connectors, on a flexible foam substrate assembly. The method generally includes disposing a portion of the substrate at a workstation and causing the solid member to move toward the substrate so that the projections penetrate the substrate to removably mount said solid member therein. This procedure is repeated as different portions of the substrate are presented to the workstation until a desired number of solid members have been mounted on the substrate. The substrate can then be reeled or arranged in such a manner to be mounted within a suitable container for future removal of the solid members from the substrate.

38 Claims, 11 Drawing Figures

PROCESS OF MANUFACTURING A FLEXIBLE SUBSTRATE ASSEMBLY

This application is a division of application Ser. No. 597,637, filed Apr. 6, 1984.

BACKGROUND OF THE INVENTION

1. Field of the Invention

The present invention is directed to packaging of solid members having extended rigid projections, particularly electrical connectors, in a flexible substrate assembly by inserting the extending projections into a surface of a continuous flexible support sheet. The present invention also is directed to an article of manufacture comprising an elongated sheet of flexible polymeric material having a plurality of electrical connectors removably secured to the polymeric sheet material by insertion of extending conductors of the connectors into the flexible sheet material. The plurality of electrical connectors having extending conductors inserted into the flexible sheet material can be cut to a predetermined length while secured to the flexible sheet material. Further, the present invention is directed to folding or bending the sheet material having a plurality of electrical connectors secured thereto in a boustrophedon pattern, or winding the flexible sheet material and attached connectors to form a stacked array for transport. The invention is further directed to a package containing a plurality of continuous elongated sheets of flexible material having the electrical connectors removably secured thereto.

2. Background of the Invention and Prior Art

Electrical connectors are mass produced by positioning an insulative housing, generally a plastic rectangularly shaped member, automatically at various locations along an assembly line for pin insertion and other machine accomplished steps until the electrical connector is in its final manufactured form. Once the electrical connector is completed, the connectors are automatically conveyed to a completed connector hopper positioned to receive the connectors from a conveyor so that the completed connectors fall one by one into the hopper where they fall upon each other. The completed connectors falling upon each other sometimes cause damage to the extending pins or conductors such as by causing some of the plated-on highly conductive metal to be scraped away from the conductors or pins or by bending the pins.

The connectors are manually removed from the hopper, one by one, inspected and manually packaged. Packaging the connectors can be done in bulk by filling a plastic bag or other suitable container with a number of connectors in contact with each other in a random manner, but bulk packaging generally is unsuitable because many of the connectors are damaged during transport. Another more time consuming and expensive method of packaging connectors has been by manually aligning the connectors in layers in a suitable container, such as a cardboard box, to minimize the connector contact during storage. A layer of compressible material sometimes is disposed between each layer of hand packed connectors to minimize the damage to the connectors during transport.

Recently, the assignee of this application has packaged connectors by aligning the connectors longitudinally in plastic tubes so that the connectors come into contact with each other only at plastic housing ends so that the conductors or pins extending from the connector housings do not contact each other during transport.

Another prior art method of packaging connectors has been to provide individual support trays having individual recesses shaped generally to conform to the profile configuration of an individual connector so that each connector is packaged in its own individual recess of a tray and a compressible sheet of material can be layered over the tray to minimize the possibility of the packaged connectors contacting each other during transport. This method of packaging, of course, is extremely expensive, requires a great amount of packaging space to package a small number of connectors, and each connector must be manually packed.

It is believed that some electrical circuit elements, such as transistors, have been packaged by inserting the extending conductors into a rigid foam block, such as styrofoam, in a single layer requiring a massive amount of packaging space for only a few circuit elements. For shipment, the layer of circuit elements must be held into the styrofoam block with a contacting pressure layer of packaging material to prevent the circuit elements from falling out of the styrofoam during transport.

SUMMARY OF THE INVENTION

In brief, the present invention is directed to packaging a plurality of electrical connectors on a flexible support sheet by inserting the extending conductors of each electrical connector into the surface of the flexible support sheet to removably retain the electrical conductors onto the flexible support sheet and thereby manufacture a flexible substrate assembly. The methods, apparatus, and articles of manufacture disclosed herein are applicable to any solid member having rigid extending projections, such as electrical connectors.

In accordance with the present invention, a plurality of solid members having extending rigid projections are removably retained in a predetermined disposition on a flexible support substrate to form a flexible substrate assembly by disposing one of the solid members in juxtaposition to the support substrate such that the projections of the one solid member extend toward a surface of the substrate and then forcing the one solid member toward the substrate surface to insert the projections into the substrate surface thereby forming projection retaining apertures in the substrate surface defined by a substrate surface configuration surrounding the inserted projections, and to removably retain the one solid member on the substrate. A second solid member then is disposed in juxtaposition to the substrate such that the projections of the second solid member extend toward the substrate. The second solid member then is forced toward the flexible substrate to contact the substrate surface with the projections of the second solid member and to insert the projections of the second solid member into the substrate surface and to removably retain the second solid member on the substrate at a predetermined location with respect to the one solid member. In a preferred embodiment, the solid members are electrical connectors having an insulative housing and a plurality of rigid electrical conductors extending outwardly from the housing.

In accordance with an important feature of the present invention, the flexible substrate permits packaging a plurality of connectors in a stacked array by disposing one of the electrical connectors in juxtaposition to a flat flexible support substrate portion at a work station such that the conductors of the one electrical connector are essentially perpendicular to a surface of the flexible substrate, forcing the one electrical connector toward the substrate surface to insert the conductors into the substrate surface thereby forming conductor retaining apertures in the substrate surface defined by a substrate surface configuration surrounding the inserted conductors, and to removably retain the one electrical connector on the substrate; moving the substrate so that the solid member is moved away from the work station and another flat substrate portion is provided at the work station; disposing a second electrical connector in juxtaposition to the substrate such that the conductors of the second electrical connector are essentially perpendicular to the other substrate surface portion; forcing the second electrical connector toward the substrate to insert the conductors of the second electrical connector into the substrate surface and to removably retain the second electrical connector on the substrate at a predetermined location with respect to the one electrical connector; and repeating the solid member insertion steps until a desired number of solid members are inserted into the substrate. The flexible substrate assembly can be bent to stack the substrate assembly upon itself to provide a plurality of connectors removably retained on the flexible substrate in a stacked array.

In accordance with another important embodiment of the present invention a plurality of electrical connectors can be cut to a predetermined length from a longer electrical connector by disposing the longer electrical connector in juxtaposition to a flexible support substrate such that the conductors of the longer connector are essentially perpendicular to a surface of the flexible substrate; forcing the longer electrical conductor toward the substrate surface to insert the conductors into the substrate surface and to removably retain the longer electrical connector on the substrate; and cutting the longer electrical connector, while the longer electrical connector is retained on the substrate, to form a plurality of electrical connectors of predetermined length, each of the plurality of connectors having a plurality of extending conductors inserted in the substrate surface.

In accordance with another important feature of the present invention, a plurality of electrical connectors can be cut into smaller electrical connectors of predetermined length in the manner while the plurality of electrical connectors are removably retained on the flexible support substrate, particularly by cutting the longer electrical connectors in a direction transverse to the longitudinal axis of the longer electrical connectors while the connectors are retained on the flexible substrate.

Accordingly, an object of the present invention is to provide a method of removably retaining a plurality of solid members, having extending rigid projections, onto a flexible sheet material.

Another object of the present invention is to provide a method of and apparatus for manufacturing a flexible substrate assembly comprising a plurality of solid members mounted on a flexible support sheet.

Still another object of the present invention is to provide a method of packaging solid members having extending rigid projections, and an article of manufacture, by inserting the rigid projections into a flexible support material.

Another object of the present invention is to provide a method of packaging electrical connectors having extending rigid conductors, and an article of manufacture, by inserting the extending conductors into a flexible support material.

Yet another object of the present invention is to provide a method of packaging electrical connectors in a stacked array, and an article of manufacture, by bending a flexible substrate having conductors of a plurality of electrical connectors inserted into the substrate, to stack a connector retained in the flexible substrate above another connector retained in the flexible substrate to provide a plurality of connectors removably retained on the flexible substrate.

BRIEF DESCRIPTION OF THE DRAWINGS

The above and other objects and advantages of the present invention will become apparent with reference to the drawings wherein.

DETAILED DESCRIPTION OF THE PREFERRED EMBODIMENTS

Turning now to the drawings and initially to FIGS. 1 and 3-6, there is illustrated a plurality of electrical connectors 12 inserted into a sheet or web of flexible polymeric material 14 in accordance with the principles of the present invention. The electrical connectors 12 include an insulative housing 16 having a plurality of electrically conductive pins 18 extending from the housing 16. It is understood, however, that the principles of the present invention are equally applicable to any solid member having rigid projections extending therefrom, such as other electrical circuit members.

Figure 1:
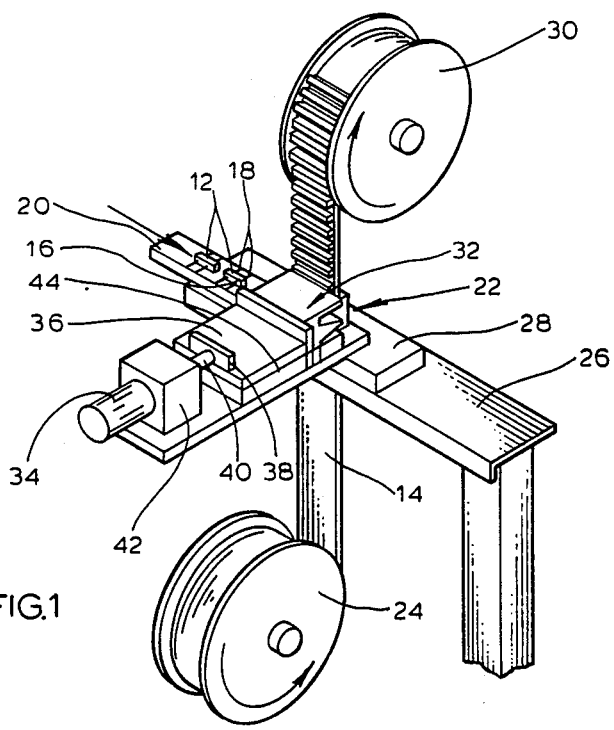
FIG. 1 is a perspective view of the method and apparatus for inserting electrical connectors into a flexible sheet material in accordance with the present invention.

As shown in FIG. 1, completed electrical connectors 12 are conveyed along a conveyor platform 20 in single file longitudinal alignment to an insertion station, generally designated 22. En route to the insertion station 22, for example along the connector conveyor platform 20, the connectors 12 can be manually or mechanically inspected for conductor damage, for example by laser or sonic inspection prior to insertion into the polymeric sheet material 14.

The sheet or web of flexible polymeric material 14 is supplied at the insertion station 22 from a sheet material supply roll 24 and passes vertically upwardly through conveyor support platform 26 and conveyor support bar 28. The completed connectors 12 conveyed along the completed connector conveyor platform 20 are conveyed to the insertion station 22 in alignment, one at a time, with the continuous sheet or web of flexible polymeric material 14 where each completed connector 12 is sequentially inserted into the sheet material 14. The completed connectors 12 are conveyed to the insertion station 22 in alignment with the sheet material 14 such that a plurality of electrically conductive pins 18 extending from the connector insulative housings 16 are disposed substantially perpendicular to a surface of the polymeric sheet material 14, as shown in FIGS. 1 and 3–6. A packaged connector take up reel 30 is disposed above the insertion station 22 and is automatically rotated at a predetermined speed by a suitable motor (not shown) to wind the packaged connectors 12 retained on the flexible support sheet 14 onto the reel 30 at a predetermined transverse spacing between longitudinally parallel connectors 12.

In accordance with an important feature of the present invention, the flexible support material 14 must be non-rigid. It has been found that non-rigid support sheets 14 are able to grasp inserted rigid projections, such as connector pins 18, relatively tightly. Further, the holes or apertures made by the pins 18 upon insertion into the flexible sheet material 14 do not enlarge when the flexible material and inserted connectors are moved or vibrated during transport because of the pliable nature of flexible sheet or foam materials. Rigid materials, such as rigid foam material, will permanently distort to enlarge pin receiving apertures if force is applied by inserted pins against the rigid foam material surrounding and defining the pin receiving apertures. Rigid material capable of pin-receiving aperture enlargement during transport is not suitable as a connector packaging support material since a great many of the connectors would separate from the support material during transport.

Any flexible or semi-rigid but pliable tape, sheet or web of polymeric material in solid or foam form are suitable as the flexible support material 14 of the present invention. Suitable flexible polymeric support materials include: the polyolefins, such as polyethylene and polypropylene in solid or foamed form; any of the flexible solid and foam materials manufactured from elastomeric resins so long as they are capable of being punctured by the rigid conductors of a connector; cast or extruded films or sheets of acrylics, such as polyacrylates, polymethacrylates and copolymers thereof; cellulose acetate; cellulose triacetate; other cellulosics from solution or dispersion; polytetrafluoroethylenes; polycarbonates polyethersulfone; polyethylene terephthalate; polyimides; polyvinyl alcohol; polyvinyls, polyvinyl chloride and vinyl coppolymers; ethylenevinyl acetate; polyethylene oxide and polyurethane so long as the sheets or webs 14 are non-rigid and capable of being punctured by the extending rigid conductors or pins 18 of a connector 12. Suitable flexible sheet material is for example 1/32 to $\frac{1}{8}$ inch thick. Foam material having a thickness of about 1/16 inch provides effective retention of the connectors 12 while not occupying excessive packaging space. The sheet material should not be so thick that penetration of pins 18 will cause the pins 18 to bend. The flexible sheets or webs 14 useful in accordance with the present invention can have a relatively dense and rigid surface skin so long as the flexible sheet 14 is non-rigid at its center or core since the core of the flexible sheet material 14 will remain pliable to grasp and retain inserted pins 18.

Flexible foam materials are particularly well adapted for retaining inserted pins 18 particularly the closed cell foams or partly open cell foams. Flexible foam support materials 14 include multiple spaced films of polymeric material capable of grasping the inserted pins 18 at spaced locations to provide good retention of the connector on the flexible material, yet allowing the connector 12 to be removed with a relatively small force perpendicular to the surface of the foam sheet material. The closed cell and partly open cell foams will provide more resistance to penetration of pins 18 resulting from increased pressure within the closed cells as the pins 18 attempt to penetrate the closed cells. This increased resistance causes the polymeric cell material to stretch somewhat to provide more gripping polymeric material in the immediate area of pin penetration to grip the pins 18 more tightly once penetration occurs. The open cell foams also provide a polymeric material stretching advantage to provide for greater retention but to a lesser extent. Rigid foams such as rigid epoxys and rigid polyesters are not suitable as the support sheet 14 since the pin receiving apertures will enlarge during transport and many of the connectors 12 will separate from the foam material.

Referring again to the drawings, the insertion station, generally designated 22, includes a connector insertion bar, generally designated 32, operatively connected to hydraulic cylinder 34. The connector insertion bar 32 is operatively connected to the hydraulic cylinder 34 through insertion bar slide plate 36, hydraulic cylinder piston support bar 38 and hydraulic cylinder piston 40. The hydraulic cylinder piston 40 is operatively connected to the hydraulic cylinder 34 through an annular alignment aperture (not shown) in hydraulic cylinder support block 42. As shown in FIGS. 1 and 3–6, the connector insertion bar 32 and the insertion bar slide plate 36 slide toward and away from the polymeric sheet material 14 on support plate 44 for insertion of the extending pins 18 of completed connectors 12 into the surface of the flexible polymeric sheet material 14.

Figure 5:
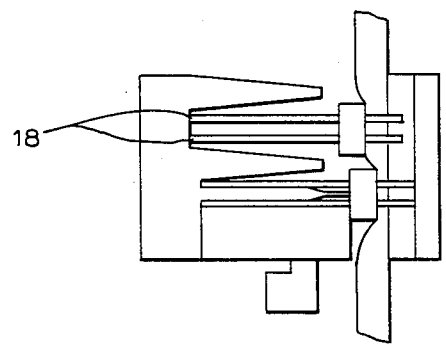
Figure 6:
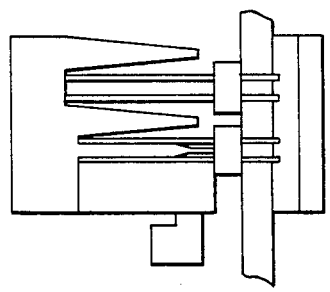

The connector insertion bar 32 includes an elongated insertion plate 46 for forcing the extending pins 18 of individual connectors 12 against the polymeric sheet material 14. As shown in detail in FIGS. 3–6, the insertion plate 46 forces the extending pins 18 into the flexible polymeric sheet material 14 to retain the connectors 12 on the flexible sheet material 14. The connector insertion bar 32 also includes a pair of integral spaced alignment plates 48 for maintaining a substantially perpendicular alignment of an inserted connector 12 adjacent to a connector 12 being inserted. The pair of alignment plates 48, like the insertion plate 46 extend outwardly from an insertion bar base 50 in a direction perpendicular to a major surface 52 of the flexible polymeric support sheet 14. The pair of alignment plates 48 are spaced a predetermined distance at the insertion bar base 50 to provide an elongated slot 54 at the base 50 so that the conductive pins 18 of the electrical connectors 12 fit between the pair of alignment plates 48 to contact the base wall of the elongated slot 54. In this manner, as best shown in FIG. 5, the pins 18 of an inserted connector 12 are retained between the pair of alignment plates 48 to maintain the inserted connector 12 in substantially perpendicular alignment with respect to the major surface 52 of the polymeric sheet material 14 while an adjacent next lower connector 12 is inserted into the polymeric sheet material 14.

The insertion station 22 includes a horizontally reciprocable connector pin support bar 56, having a forward stop wall 57, and an adjacent elongated, L-shaped vertically reciprocable connector housing support bar 58 to define an elongated rectangular connector housing support slot 60 for receiving and supporting the insulative housings 16 of connectors 12. The elongated, L-shaped vertically reciprocable connector support bar 58 includes a vertical connector housing stop wall 62 to prevent movement of the connector 12 toward the major surface 52 of the polymeric support material 14 after the connector pin support bar 56 is moved forwardly to contact stop wall 57 against connector support bar stop surface 62. The L-shaped vertically movable connector support bar 58 must be moved vertically downwardly, as shown in FIG. 5, to permit the connector insertion plate 46 to force the connector 12 in a direction toward the flexible polymeric sheet material 14 for insertion of the electrically conductive pins 18 of the connector 12 into the flexible polymeric sheet material 14. When the connector contacting insertion bar 32 retracts to the position shown in FIG. 3, after insertion of a connector 12, the L-shaped vertically movable connector support bar 58 retracts vertically upwardly to the position shown in FIG. 3 to receive another conveyed connector 12 in the elongated rectangular housing support slot 60. The insertion steps then can be repeated for insertion of another connector 12 into the flexible polymeric sheet material 14.

In accordance with an important feature of the present invention, it has been found that by inserting a plurality of connectors in an aligned, relatively dense array on the flat, flexible sheet material 14, it is relatively easy to detect defects in the upwardly extending conductors or pins 18. The relative density of the upstanding pins 18 when a number of connectors are aligned on the sheet material 14 provides for easy detection of a bent or missing pin and for tarnished or discolored conductive pin plating. The damaged connectors can be easily removed from the flexible support sheet 14 and replaced.

Further, the connectors can be inserted onto the sheet material in spaced groups of rows to provide for quick assessment of the number of connectors packaged. For example, the connectors can be inserted into the flexible sheet material 14 in relatively closely spaced groups of n rows followed by an optically recognizable wider space, followed by another relatively closely spaced group of n more rows, and so on. The number of groups of n connectors can be easily counted to determine the total number of packaged connectors.

As shown in FIGS. 3-6, the insertion station 22 also includes an insertion station sheet material support plate generally designated 64 vertically disposed behind the flexible sheet material 14. The support plate 64 includes a rigid pin receivable layer 66 adhered to its sheet material facing surface 68.

Figure 2:
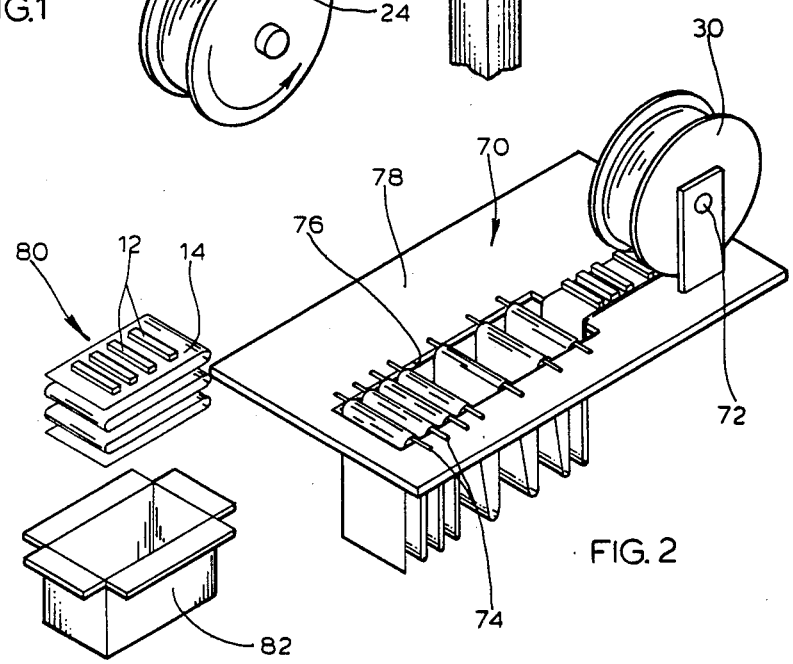
FIG. 2 is a perspective view showing the flexible substrate and inserted connectors of the present invention being festooned or folded to package a continuous web of substrate and retained connectors in rectangular form for transport.
Figure 3:
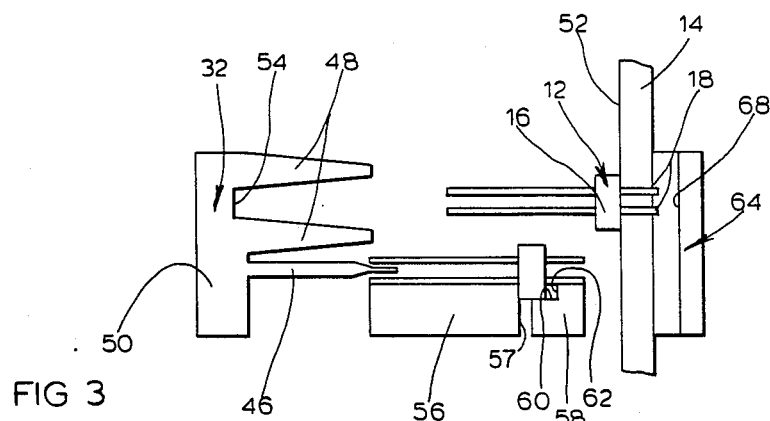
FIGS. 3-6 are side views of a connector insertion station portion of the method and apparatus of FIG. 1, showing insertion of a connector into a flexible support sheet.
Figure 4:
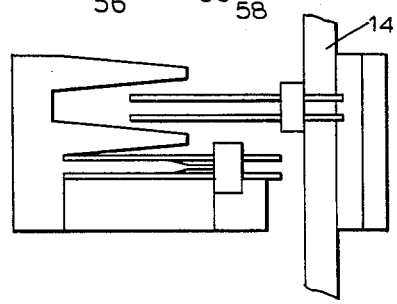

The completed, substrate assembly wound onto take-up reel 30. The packaged connectors 12 inserted into the flexible polymeric material 14 on take up reel 30 can be re-packaged in different form at a folding station generally designated 70. At folding station 70, the take-up reel 30 can be disposed on a removable reel axis 72 so that the plurality of connectors 12 and the flexible polymeric sheet material 14 can be draped over movable fold pins 74 disposed to overlie a rectangular slot 76 in folding station plate 78. The movable fold pins 74 can be moved away from the reel 30 after the material is draped over the festoon pin 74 at regular time intervals to fold the substrate assembly upon itself in a boustrophedon pattern, as 12 retained in the flexible sheet, generally designated 80 in FIG. 2. As shown in FIG. 2, the stacked array of festooned packaged connectors 12 on flexible sheet material 14 can be suitably packaged in a container, such as rectangular cardboard box 82. For this purpose, the substrate is folded so that each layer has a length approximately equal to the length of the cards and box 82.

Figure 7:
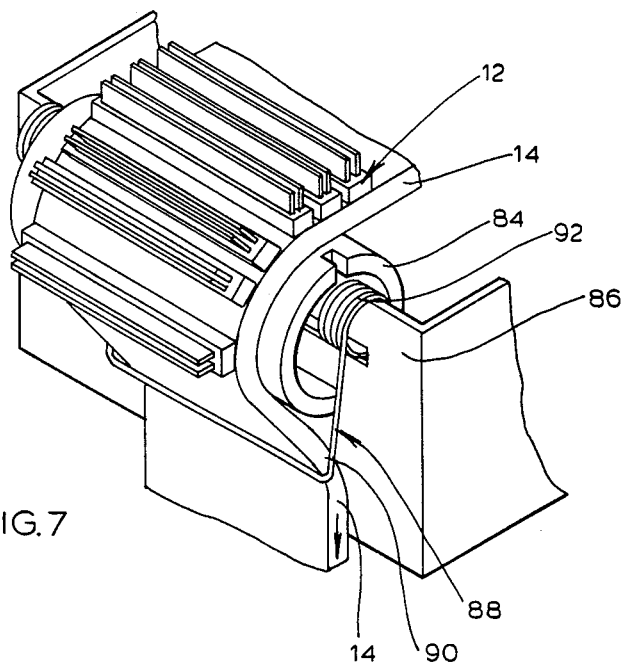
FIG. 7 is an enlarged partially broken away perspective view of the apparatus of the present invention showing a flexible sheet support roller and sheet hold-down spring for disposing connectors, one at a time, at a work station.
Figure 11:
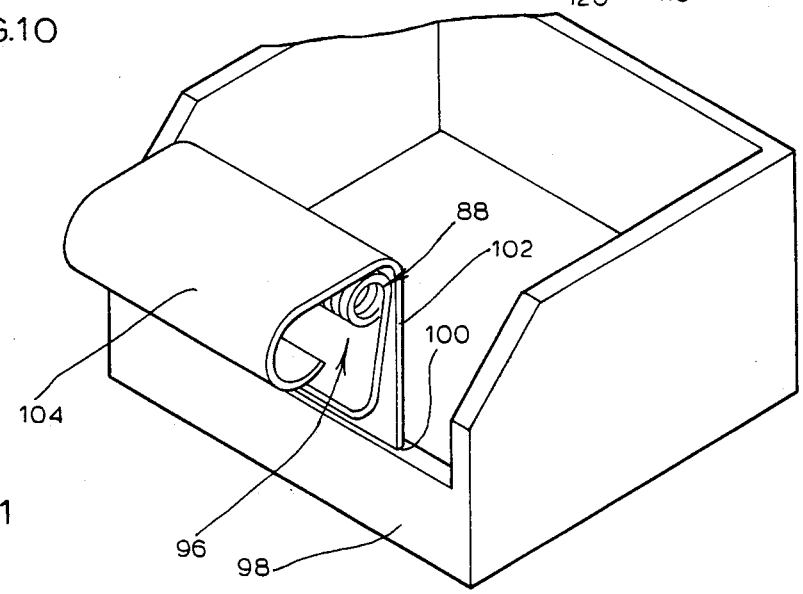
FIG. 11 is a perspective view of a sheet material support platform and sheet material hold-down spring attached to a sheet material container, constructed in accordance with the principles of the present invention.

In accordance with another important embodiment of the present invention, the packaged connectors 12 retained on the flexible sheet material 14 (see FIGS. 7-9) can be disposed at a predetermined disposition relative to a work station by positioning the flexible substrate assembly over a roller 84 or an L-shaped assembly support lip 96 connected to a suitable substrate assembly container, e.g. a plastic or cardboard hopper 86 (FIG. 7) or 98 (FIG. 11), so that each individual connector 12 can be sequentially disposed at a predetermined location or work station in an exposed manner overlying the roller 84, or sheet material support lip 96, for individual removal from the polymeric sheet material 14. The assembly support lip or platform 96 is L-shaped including a vertical arm portion 102 and a perpendicular, integral leg or lip portion 104. The assembly support lip 96 is retained in a slot 100 in the hopper 98, as shown in FIG. 11. A substrate assembly retained in the hopper 98 is draped over the extending leg portion 104 to position a connector at a predetermined location on the lip 96. The substrate assembly is moved with respect to the lip 96 after removal of each connector 12 to position another connector 12 at the proper location on the lip 96. In this manner, each individual connector 12 can be removed automatically, such as by a robot arm, and the polymeric sheet material can be moved downwardly, as shown in FIG. 7, to position a next adjacent connector 12 sequentially at the predetermined disposition with respect to the work station for automatic removal, such as by a robot arm.

In accordance with another important feature of the present invention, the roller support structure 86 and sheet material support lip 96 include a sheet material hold-down spring 88 to stabilize the polymeric material 14 against movement away from the roller 84 during removal of a connector 12 from the polymeric material 14. The hold-down spring 88 generally comprises a U-shaped wire member 90 integral with coil spring 92 to bias the U-shaped wire member 90 against the polymeric sheet material 14 in a direction toward the hopper 86 to hold the polymeric sheet material 14 against the hopper during removal of a connector 14 from the polymeric sheet material 14.

Figure 8:
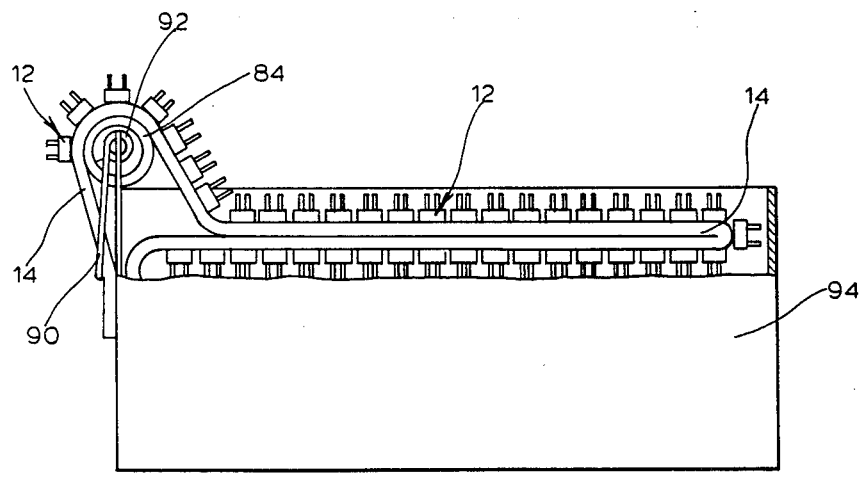
FIG. 8 is a partially broken away side view of the apparatus of FIG. 7 showing the disposition of an electrical connector at a work station from a packaged continuous web of flexible sheet material and inserted connectors, packaged in festooned or folded form.

As shown in FIG. 8, the roller 84 can be suitably attached to a package 94 such as a rectangular cardboard box for removal of a stacked array of the substrate assembly in a boustrophedon pattern.

Figure 9:
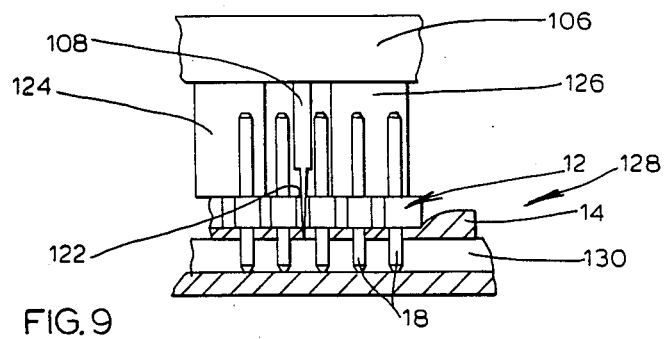
FIG. 9 is a partially broken away side view of a cutting blade assembly constructed in accordance with the principles of the present invention for cutting a connector into a plurality of smaller connectors while retained on a flexible support sheet.
Figure 10:
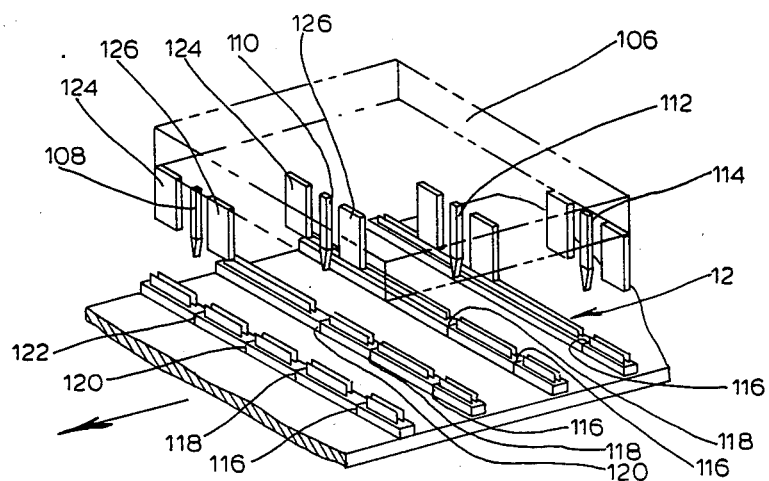
FIG. 10 is a perspective view of the cutting blade assembly of FIG. 9 showing the cutting sequence of a plurality of longitudinally and transversely spaced blades.

In accordance with another important embodiment of the present invention, as shown in FIGS. 9 and 10, connectors 12 can be cut into a plurality of smaller connectors while the connectors 12 are retained on the flexible polymeric sheet material 14. In accordance with an important feature of the present invention, a cutting blade support plate 106 is provided with a plurality of cutting blades 108, 110, 112 and 114, spaced from each other both longitudinally and transversely so that four transversely spaced connectors 12 can be cut simultaneously to provide a first transverse cut 116 at different longitudinal dispositions in each connector 12. To achieve the full advantage of the cutting embodiment of the present invention, each connector 12 is cut at only one location at a time to prevent the connector 12 from being stressed between simultaneous, multiple spaced cutting blades. As the sheet material 14 and retained connectors 12 are moved in a direction of the arrow as shown in FIG. 10, each time the cutting blade support plate 106 is moved downwardly for cutting, each connector 12 will receive another cut at a different longitudinal location. In the embodiment shown in FIG. 10, each connector 12 is cut at four longitudinal locations: at 116, 118, 120 and 122 step-wise, when the flexible sheet material 14 is moved the transverse spacing distance between connectors and the blades are lowered. After each cut, the flexible sheet material again is advanced a distance equal to the traverse spacing between adjacent rows of connectors 14.

As shown in FIG. 10, surrounding each cutting blade 108, 110, 112, and 114 is a pair of alignment blocks 124 and 126 longitudinally aligned with each cutting blade. The alignment blocks 124 and 126 are adapted to fit between the pins 18 of the connectors to hold the connectors substantially vertical during cutting, as shown in FIG. 9. As shown in FIG. 9, the polymeric sheet material and retained connectors are positioned for cutting at a cutting station, generally designated 128. A pin receiving material or space 130 is disposed under the polymeric sheet material 14 to receive the extending pin conductors 18. During connector cutting, the pins 18 are forced downwardly through the polymeric sheet material 14 because of the downward force on the connectors 12 from the cutting blades 108, 110, 112 and 114 and alignment plates 124 and 126. The pin receiving material or air space 130 prevents the pins 18 from being damaged when connectors 12 are cut.

What is claimed is:

1. A method of manufacturing a flexible substrate assembly, said assembly including a plurality of solid members, each solid member having a plurality of spaced apart rigid pin-like projections extending therefrom, mounted on a flexible support substrate, said method comprising the steps of:
   (a) disposing a portion of said substrate in a generally flat configuration at a work station;
   (b) disposing one of said solid members in juxtaposition to said flat substrate portion at said work station such that the projections of said solid member exend toward said substrate;
   (c) moving said solid member with respect to said flat substrate portion at the work station so that said projections penetrate the substrate to removably mount said solid member therein;
   (d) moving said substrate so that said mounted solid member is moved away from said work station and another flat substrate portion is provided thereat;
   (e) disposing another solid member at said work station as set forth in step (b) above;
   (f) moving said another solid member with respect to said another flat substrate portion as set forth in step (c) above;
   (g) repeating steps (d), (e) and (f) until a desired number of solid members have been mounted on said substrate.

2. The method of claim 1 wherein said solid members comprise electrical connectors and wherein said extending rigid projections comprise metal electrical conductors.

3. The method of claim 1 wherein said solid members are inserted into said flexible substrate such that longitudinal axes of adjacent solid members are disposed substantially parallel.

4. The method of claim 1 wherein a first plurality of said solid members are inserted into said flexible substrate in longitudinal alignment and a second plurality of said solid members are inserted into said flexible substrate in a disposition transversely spaced from said first plurality of solid members.

5. The method of claim 1 including bending said flexible substrate assembly to stack a solid member retained in said flexible substrate above another solid member retained in said flexible substrate to provide a plurality of solid members removably retained on a continuous flexible substrate in a stacked array.

6. The method of claim 1 including maintaining said solid members in substantially perpendicular alignment to said support substrate at said work sation during step (c).

7. The method of claim 1 wherein step (c) includes disposing said solid member in juxtaposition to said support substrate while retaining the solid member against a stop wall to prevent insertion of the projections, and then removing the stop wall to permit insertion of said projections of said solid member into the support substrate.

8. The method of claim 1 wherein said solid members are inserted into said support substrate automatically at said work station and whrein step (d) includes the step of moving the support substrate with respect to the insertion station a predetermined distance for insertion of a plurality of solid members in a predetermined space relation one to another.

9. The method of claim 1 wherein said flexible support substrate comprises a polymeric foam material having a thickness of about 1/32 inch to about ½ inch.

10. A method of removably retaining a plurality of solid members having extending rigid projections in a predetermined disposition on a flexible support substrate comprising:
   disposing one of said solid members in juxtaposition to said support substrate such that said projections of said one solid member extend toward a surface of said substrate;
   forcing said one solid member toward said substrate surface to insert said projections into said substrate surface thereby forming projection retaining apertures in said substrate surface defined by a substrate surface configuration surrounding said inserted projections, and to removably retain said one solid member on said substrate;
   disposing another of said solid members in juxtaposition to said substrate such that said projections of said another solid member extend toward said substrate; and
   forcing said another solid member toward said substrate to contact said substrate surface with said projections of said another solid member to insert said projections of said another solid member into said substrate surface and to removably retain said another solid member on said substrate at a predetermined location with respect to said one solid member.

11. The method of claim 10 wherein said solid members comprise electrical connectors and wherein said extending rigid projections comprise metal electrical conductors.

12. The method of claim 10 wherein said solid members are inserted into said flexible substrate such that longitudinal axes of adjacent solid members are disposed substantially parallel.

13. The method of claim 10 wherein a first plurality of said solid members are inserted into said flexible substrate in longitudinal alignment and a second plurality of said solid members are inserted into said flexible substrate in a disposition transversely spaced from said first plurality of solid members.

14. The method of claim 10 including bending said flexible substrate assembly to stack a solid member retained in said flexible substrates above another solid member retained in said flexible substrate to provide a plurality of solid members removably retained on a continuous flexible substrate in a stacked array.

15. The method of claim 10 including maintaining said solid members in substantially perpendicular alignment to said support substrate at said work sation during step (c).

16. The method of claim 10 wherein step (c) includes disposing said solid member in juxtaposition to said support substrate while retaining the solid member against a stop wall to prevent insertion of the projections, and then removing the stop wall to permit insertion of said projections of said solid member into the support substrate.

17. The method of claim 10 wherein said solid members are inserted into said support substrate automatically at said work and including the step of moving the support substrate with respect to the insertion station a predetermined distance for insertion of a plurality of solid members in a predetermined spaced relation one to another.

18. The method of claim 10 wherein said flexible support substrate comprises a polymeric foam material having a thickness of about 1/32 inch to about ½ inch.

19. A method of packaging a plurality of electrical connectors in a stacked array, each connector having an insulative housing and a plurality of rigid electrical conductors extending outwardly from said housing comprising:
disposing one of said electrical connectors in juxtaposition to a flexible support substrate such that said conductors of said one electrical connector are essentially perpendicular to a surface of said flexible substrate;
moving said one electrical connector with respect to said substrate surface to insert said conductors into said substrate surface to removably retain said one electrical connector on said substrate;
disposing another of said electrical connectors in juxtaposition to said substrate such that said conductors of said another electrical connector are essentially perpendicular to said substrate surface;
moving said another electrical connector with respect to said substrate to insert said conductors of said another electrical connector into said substrate surface to removably retain said another electrical connector on said substrate at a predetermined location with respect to said one electrical connector; and
bending the flexible substrate having said electrical connectors removably retained thereon to stack a connector retained in said flexible substrate above another connector retained in said flexible substrate to provide a plurality of connectors removably retained on said flexible substrate in a stacked array.

20. The method of claim 19 wherein the connectors retained on the flexible substrate are stacked by winding the substrate and retained connectors upon each other in reel form to provide an annular array of connectors retained in and spaced by said flexible substrate.

21. The method of claim 19 including folding the substrate and retained solid members in a boustrophedon pattern to stack the connectors retained on the substrate.

22. The method of claim 21 including spacing said connectors on said flexible substrate such that said substrate can be festooned and folded to provide an intermediate layer of flexible substrate between adjacent stacked layers of connectors.

23. The method of claim 19 including disposing a plurality of said arrays of substrate retained connectors in a container for transport.

24. The method of claim 19 wherein said plurality of solid members are inserted into said flexible substrate such that longitudinal axes of adjacent solid members are disposed substantially parallel.

25. The method of claim 19 including maintaining said one solid member in substantially perpendicular alignment to said support substrate while inserting the projections of said another solid member into said support substrate.

26. The method of claim 19 including disposing said solid member in juxtaposition to said support substrate while retaining the solid member against a stop wall to prevent insertion of the projections, and then removing the stop wall to permit insertion of said projections of said solid member into the support substrate.

27. The method of claim 19 wherein said solid members are inserted into said support substrate automatically at an insertion station and moving the support substrate with respect to the insertion station a predetermined distance for insertion of a plurality of solid members in a predetermined spaced relation one to another.

28. The method of claim 19 wherein said flexible support substrate comprises a polymeric foam material having a thickness of about 1/32 inch to about ½ inch.

29. A method of manufacturing a plurality of electrical connectors of predetermined length from a longer electrical connector having a plurality of rigid conductors extending therefrom comprising:
disposing said longer electrical connector in juxtaposition to a flexible support substrate such that said conductors of said longer connector are essentially perpendicular to a surface of said flexible substrate;
forcing said longer electrical conductor toward said substrate surface to insert said conductors into said substrate surface and to removably retain said longer electrical connector on said substrate;
cutting said longer electrical connector, while said longer electrical connector is retained on said substrate, to form a plurality of electrical connectors of predetermined length, each of said plurality of connectors having a plurality of extending conductors inserted in said substrate surface.

30. The method of claim 29 including cutting a plurality of longer electrical ocnnectors into smaller electrical connectors of predetermined length while said plurality of electrical connectors are removably retained on said flexible support substrate.

31. The method of claim 29 including cutting said longer electrical connector in a direction transverse to a longitudinal axis of said longer electrical connector.

32. The method of claim 29 including cutting said longer electrical connector in a plurality of locations transverse to a longitudinal axis of said longer electrical connector.

33. The method of claim 32 including making said plurality of cuts sequentially so that said longer electrical connector is not cut twice at the same time.

34. The method of claim 29 including disposing a plurality of longer electrical connectors in juxtaposition to said substrate and forcing said plurality of electrical connectors toward said substrate to insert said conductors of said plurality of electrical connectors into said substrate at a predetermined spacing between adjacent longer electrical connectors.

35. The method of claim 34 including inserting adjacent longer electrical connectors into said flexible substrate such that adjacent longer electrical connectors have essentially parallel longitudinal axes.

36. The method of claim 35 including cutting a plurality of said longer electrical connectors into smaller electrical connectors by cutting said plurality of longer electrical connectors simultaneously.

37. The method of claim 36 including cutting said plurality of longer electrical connectors with a cutting means having a plurality of blades spaced from each other both longitudinally and transversely to provide a single cut in each longer electrical connector while cutting a plurality of said longer electrical connectors simultaneously.

38. The method of claim 37 including conveying said plurality of longer electrical connectors and said flexible substrate step-wise in a direction transverse to the longitudinal axes of said longer electrical connectors to dispose each of said longer electrical connectors in alignment with the cutting means.

* * * * *